(12) United States Patent
Li et al.

(10) Patent No.: US 10,727,618 B2
(45) Date of Patent: Jul. 28, 2020

(54) CONNECTOR WITH ANCHORING POWER PIN

(71) Applicant: Intel Corporation, Santa Clara, CA (US)

(72) Inventors: Xiang Li, Portland, OR (US); George Vergis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/316,586

(22) PCT Filed: Jul. 31, 2017

(86) PCT No.: PCT/US2017/044756
§ 371 (c)(1),
(2) Date: Jan. 9, 2019

(87) PCT Pub. No.: WO2018/031283
PCT Pub. Date: Feb. 15, 2018

(65) Prior Publication Data
US 2019/0296462 A1     Sep. 26, 2019

Related U.S. Application Data

(60) Provisional application No. 62/372,308, filed on Aug. 9, 2016.

(51) Int. Cl.
*H01R 12/58*     (2011.01)
*H01R 12/57*     (2011.01)
(Continued)

(52) U.S. Cl.
CPC ............. *H01R 12/58* (2013.01); *H01R 12/57* (2013.01); *H01R 12/7005* (2013.01);
(Continued)

(58) Field of Classification Search
CPC ...... H01H 9/42; H01H 33/185; H01H 33/164; H01H 9/34; H01H 9/446; H01H 33/167
See application file for complete search history.

(56) References Cited

U.S. PATENT DOCUMENTS 5,024,609 A * 6/1991 Piorunneck .......... H01R 12/721
                                                   439/60
6,015,299 A * 1/2000 Walse .................. H01R 12/721
                                                   439/60
(Continued)

FOREIGN PATENT DOCUMENTS

| CN | 101604796 A | 12/2009 |
|---|---|---|
| CN | 201430259 | 3/2010 |

(Continued)

OTHER PUBLICATIONS

International Search Report and Written Opinion for PCT Patent Application No. PCT/US2017/044756, dated Nov. 8, 2017, 13 pages.
(Continued)

*Primary Examiner* — Truc T Nguyen
(74) *Attorney, Agent, or Firm* — Compass IP Law, PC

(57) ABSTRACT

Anchoring power pins are described herein. In one embodiment, a system includes a circuit board including a through hole, and a connector for coupling a module with the circuit board. The connector includes housing including a module-facing side to receive the module and a circuit board-facing side to couple with the circuit board. The connector includes a conductive power pin to both physically anchor the connector to the circuit board and electrically couple the module with the circuit board, the conductive power pin including a tip protruding from the circuit board-facing side of the connector to extend into a matching through hole in the circuit board.

20 Claims, 14 Drawing Sheets

(51) Int. Cl.
  *H01R 12/70* (2011.01)
  *H01R 12/73* (2011.01)
  *H01R 13/633* (2006.01)
  *H05K 1/14* (2006.01)

(52) U.S. Cl.
  CPC ....... *H01R 12/737* (2013.01); *H01R 13/6335* (2013.01); *H05K 1/141* (2013.01); *H05K 2201/10159* (2013.01)

(56) References Cited

U.S. PATENT DOCUMENTS

| | | | |
|---|---|---|---|
| 6,305,946 B1* | 10/2001 | McHugh | H01R 12/716 |
| | | | 439/60 |
| 8,231,411 B1* | 7/2012 | Westman | H01R 13/6471 |
| | | | 439/108 |
| 2002/0019170 A1 | 2/2002 | Hassanzadeh et al. | |
| 2002/0192989 A1* | 12/2002 | Ling | H01R 13/53 |
| | | | 439/108 |
| 2006/0003618 A1 | 1/2006 | Leidy | |
| 2009/0258539 A1* | 10/2009 | Zheng | H01R 13/65802 |
| | | | 439/607.41 |
| 2009/0298303 A1* | 12/2009 | Vrenna | H01R 43/16 |
| | | | 439/55 |
| 2010/0227482 A1* | 9/2010 | MacDougall | H01R 13/24 |
| | | | 439/76.1 |
| 2011/0159718 A1 | 6/2011 | McKee | |
| 2013/0100627 A1 | 4/2013 | Cong et al. | |
| 2014/0178014 A1* | 6/2014 | Flens | G02B 6/43 |
| | | | 385/88 |
| 2018/0287326 A1* | 10/2018 | Tang | H01R 43/18 |

FOREIGN PATENT DOCUMENTS

| | | |
|---|---|---|
| CN | 101859950 A | 10/2010 |
| CN | 102832470 A | 12/2012 |
| CN | 206225600 U | 6/2017 |
| JP | 2010123119 A | 6/2010 |
| WO | 2018031283 A1 | 2/2018 |

OTHER PUBLICATIONS

Extended European Search Report for Patent Application No. 17840020.6, dated Feb. 14, 2020, 8 pages.
Chinese Translation of P.R. China State Intellectual Property Office First Office Action for Patent Application No. 201780042755.X, dated Mar. 30, 2020, pages.

* cited by examiner

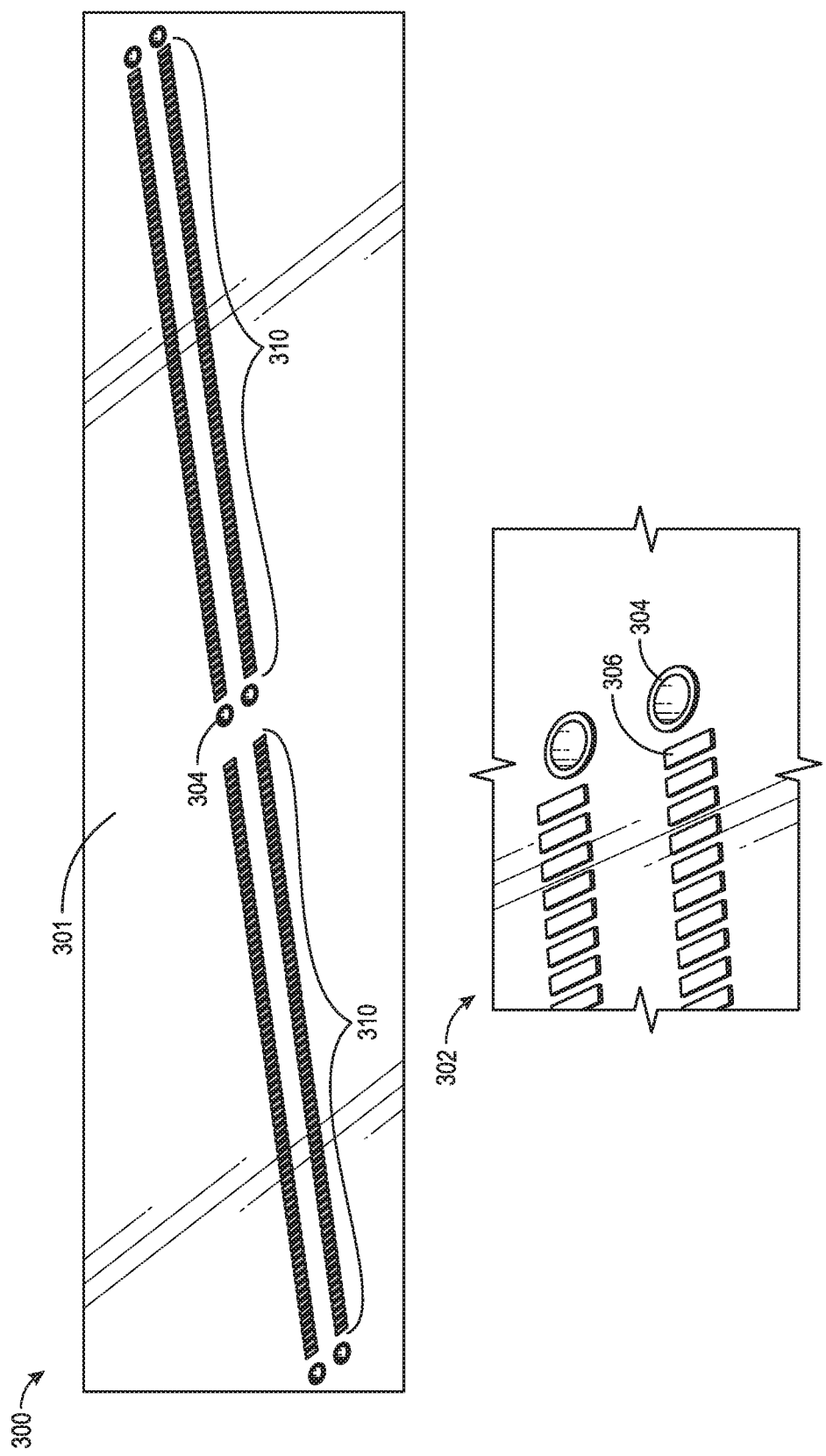

US 10,727,618 B2

CONNECTOR WITH ANCHORING POWER PIN

CLAIM OF PRIORITY

This application is a U.S. National Phase application under 35 U.S.C. § 371 of International Application No. PCT/US2017/044756 filed Jul. 31, 2017, entitled "CONNECTOR WITH ANCHORING POWER PIN," which in turn claims the benefit of U.S. Provisional Application No. 62/372,308, filed Aug. 9, 2016, entitled "CONNECTOR WITH ANCHORING POWER PIN" the entire contents of which are incorporated herein by reference.

FIELD

The descriptions are generally related to connectors, and more particularly, descriptions are related to connectors for memory modules including anchoring power pins.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2017, Intel Corporation, All Rights Reserved.

BACKGROUND

Memory module connectors are apparatuses that connect a memory module to a circuit board (e.g., a printed circuit (PC) board such as a mother board). Connectors typically have a plurality of pins to couple contacts on the memory module to contacts on the circuit board. The number of pins on the connector typically corresponds to the number of contacts on the memory module. The number of contacts on the memory module is limited by a number of factors including the size of the memory module and size and pitch of the contacts on the memory module. The size and pitch of the signal contacts on the memory module is typically optimized to minimize electromagnetic coupling while maximizing the number of contacts.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 3A illustrates a circuit board onto which a connector having an anchoring power pin can be installed, in accordance with an embodiment.

Descriptions of certain details and implementations follow, including a description of the figures, which may depict some or all of the embodiments described below, as well as discussing other potential embodiments or implementations of the inventive concepts presented herein.

DETAILED DESCRIPTION

Connectors with anchoring power pins are described herein. Anchoring power pins can enable high current delivery while also enabling mechanical retention of the connector on a circuit board. Conventional connectors typically include nonconductive retention mechanisms to anchor the connector to the circuit board and separate contacts for delivering power and transmitting signals that do not physically anchor the connector. In contrast to conventional connectors, an anchoring power pin can both physically anchor the connector to the circuit board and electrically couple the module with the circuit board to enable power delivery to the module. Therefore, an anchoring power pin can free up pins on the connector that were traditionally used for power delivery for other purposes such as the transmission of data or control signals.

Figure 1A:
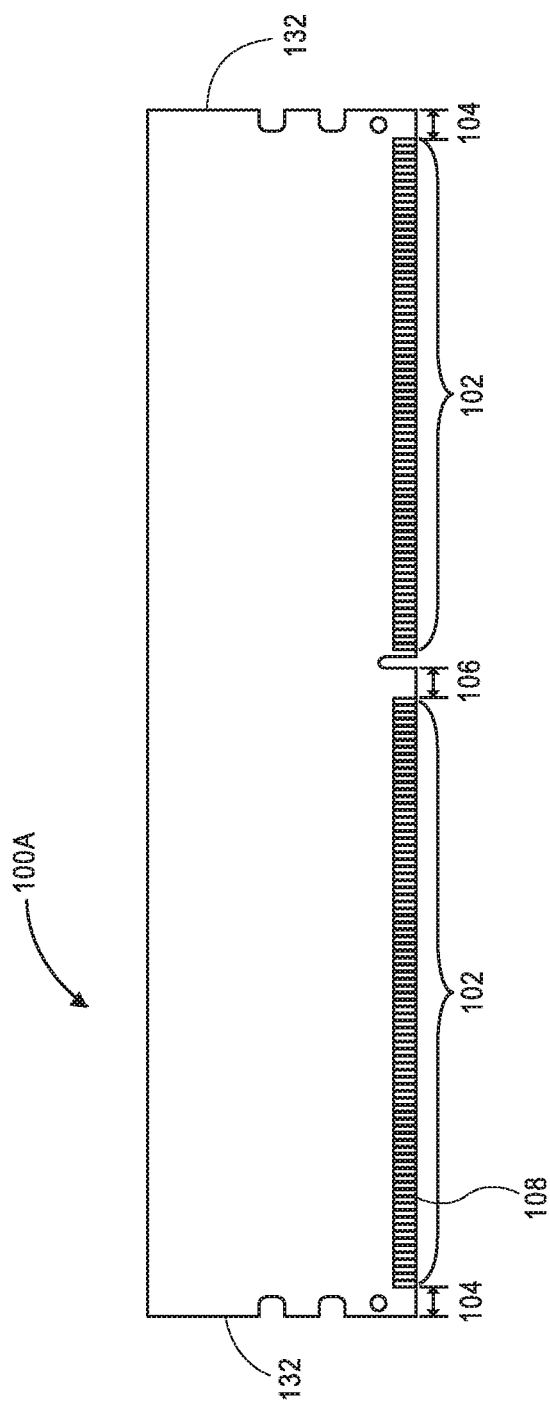
FIG. 1A illustrates an example of a memory module.
Figure 1B:
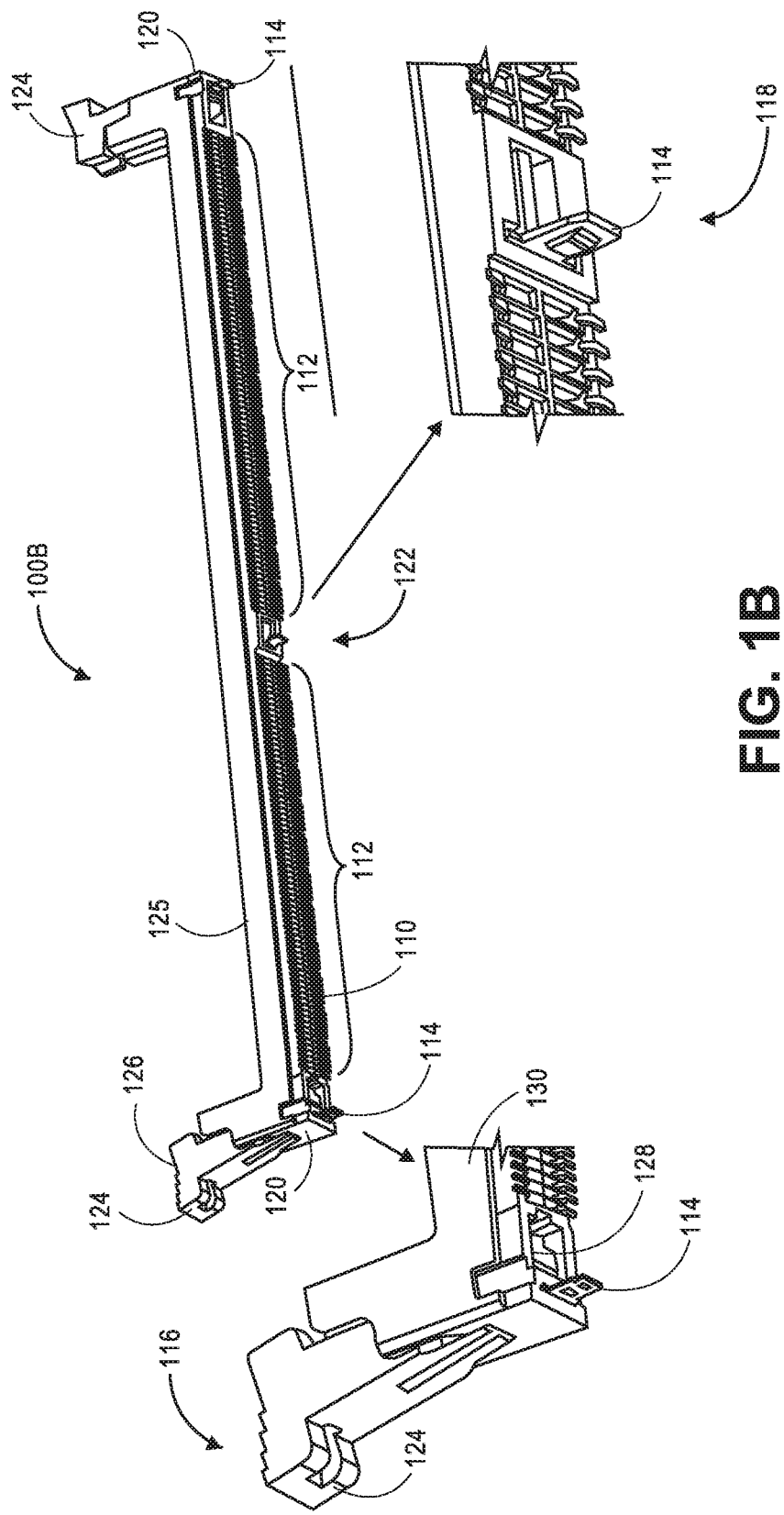
FIG. 1B illustrates an example of a connector for connecting the memory module of FIG. 1A to a circuit board.

FIG. 1A illustrates an example of a memory module that can couple with a circuit board via a conventional connector such as the connector illustrated in FIG. 1B. FIG. 1A illustrates an example of a DDR4 (double data rate fourth-generation) SDRAM (synchronous dynamic random-access memory) DIMM (dual in-line memory module). The connector 100B of FIG. 1B is a DDR4 connector.

The memory module 100A illustrated in FIG. 1A includes a plurality of contacts 102 along an edge 108. Contacts are conductive elements on or in a component to couple with another component. Examples of contacts include pins, pads, traces, and wires. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components, including the delivery of power or coupling to ground. Communicative coupling includes connections, including wired and wireless connections, that enable components to exchange data (e.g., data or control signals). FIG. 1B illustrates a connector 100B which can couple the module 100A with a circuit board (not shown in FIGS. 1A and 1B). The connector 100B includes a plurality of pins 112 that correspond with the contacts 102 of the module 100A. A pin is a type of conductive contact for physically and electrically coupling with another conductive contact (such as a pad). Conductive pins can have a shape resembling a rigid piece of wire, and can include bends to facilitate coupling with pads, such as the pins 112 of FIG. 1B.

Referring to the embodiment in FIG. 1B, the plurality of pins 112 of the connector 100B couple with contacts on a circuit board. The pins 112 include pins for transmitting signals such as data (DQ) signals, command/address (C/A) signals, ground (GND), and power (e.g., VDD). The pins 112 do not physically anchor the connector 100B to the circuit board, but can be secured in place by solder, via separate mechanical anchoring mechanisms, or both. Although the solder can provide some support to secure the pins 112 in place on the circuit board, solder alone is typically not strong enough to secure the connector to the circuit board. Therefore, connectors typically include other mechanical anchoring mechanisms. The connector 100B includes three mechanical anchoring mechanisms 114. The mechanical anchoring mechanisms 114 of FIG. 1B are referred to as "retention hooks." The retention hooks 114 are used only for mechanical retention, and not for any other purpose such as grounding or for the transmission of power or data or control signals. In the illustrated embodiment, the mechanical anchoring mechanisms 114 are nonconductive elements that only act to anchor the connector to the circuit board, and do not deliver power or transmit data or control signals. The anchoring mechanisms 114 do not extend up into the housing 130 to the area for the module because the anchoring mechanisms do not electrically couple with the module 100A. On the contrary, the typical anchoring mechanisms are specifically made to be nonconductive so as to not electrically couple or interfere with any part of the connector 100B or module 100A, in accordance with the example of FIGS. 1A and 1B.

The connector 100B includes a mechanical anchoring mechanism 114 on its bottom side 110 near each end 120 and one mechanical anchoring mechanism in a central region 122 that is between the ends 120. The magnified view 116 shows a close up view of an end 120 of the connector 100B and the magnified view 118 shows a close up view of the central region 122 of the connector 100B. The module 100A can be installed or inserted into the connector 100B into a slot or opening on the top side 125 of the connector 100B. When the module 100A is installed or inserted into the connector 100B it is "seated." When the module 100A is seated, the top 126 of the ejectors 124 moves inwards towards the seated module 100A to secure the module 100A in place. In order to eject the module 100A, the top end 126 of the ejector is rotated outwards away from the module 100A, which causes the module 100A to be ejected from the connector 100B by the application of pressure to the bottom edge 108 of the module 100A.

In the illustrated example, the ejectors 124 come into contact with a portion of the module's bottom edge 108 due to the rotating movement that occurs when installing or ejecting a module. The bottom 128 of the ejector 124 (which is partially obscured in FIG. 1B by the connector housing 130) moves or rotates in towards the pins 112 when a module is ejected and moves away from the pins 112 when a module is seated. Due at least in part to the mechanical movement of the ejectors 124, a "keep out" or "overhead" zone (e.g., region 104) is reserved on the bottom edge 108 of the module 100A near the ends 132. Therefore, in the illustrated example, the memory module 100A does not include contacts (such as the contacts 102) in the reserved region 104 because if there were corresponding connector pins 112 in that region, those pins could be damaged or deformed by the movement of the ejectors 124. Damage to or deformation of pins 112 of the connector 100B could result in misalignment with the contacts 102, which could in turn lead to electrical shorts or a lack of connection with the contacts 102 of the module 100A. Therefore, in the illustrated example, the regions 104 are not utilized for contacts or pins. In the illustrated example, the module 100A also includes a reserved region 106 near the middle of the bottom edge 108 of the module that does not include contacts to enable insertion into the connector, which has a matching key region corresponding to the reserved region 106.

Additionally, referring again to the connector 100B of FIG. 1B, the pins 112 include signal pins (e.g., high speed signal pins for transmission of data and control information) as well as power and ground pins. The signal pins and power pins of the connector 100B all have the same geometry (e.g., same length, width, thickness, and/or shape). Because the pins 112 are uniform, the pins are optimized for either signals or power, but not both (due to, e.g., the different desired characteristics for signal and power pins). In the illustrated example, the pins 112 of the connector 102B are optimized for high speed signaling, and therefore are relatively small (e.g., to minimize electromagnetic coupling between the pins). Due to the small size of each of the pins 112, each of the pins 112 has a limited capability for providing current, and thus many of the pins 112 may be necessary to provide sufficient power to the module 100A.

Figure 2A:
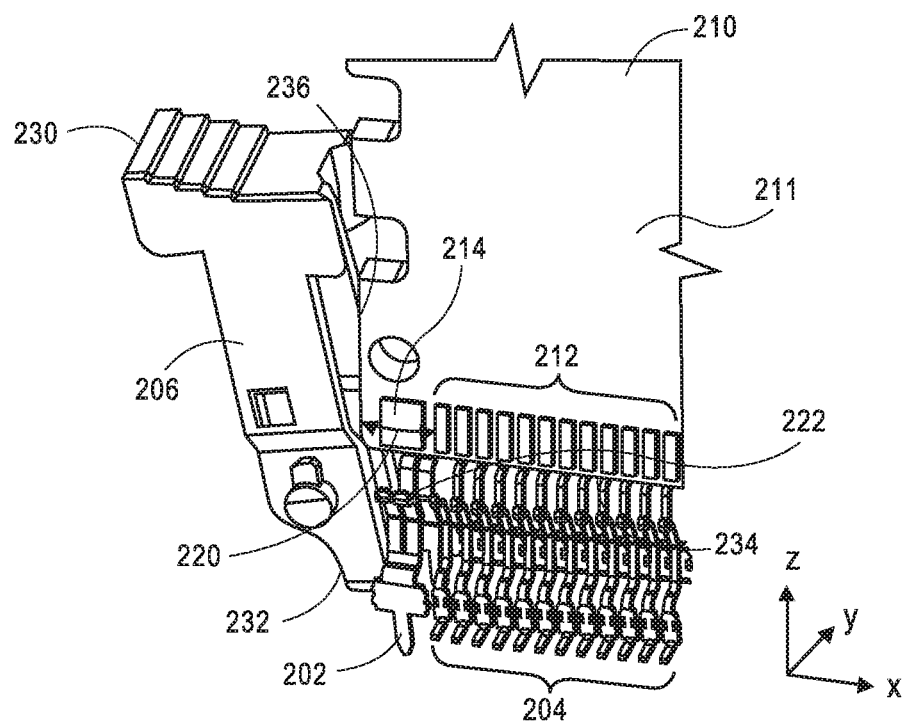
FIG. 2A illustrates a portion of a connector with an anchoring power pin, in accordance with an embodiment.
Figure 2B:
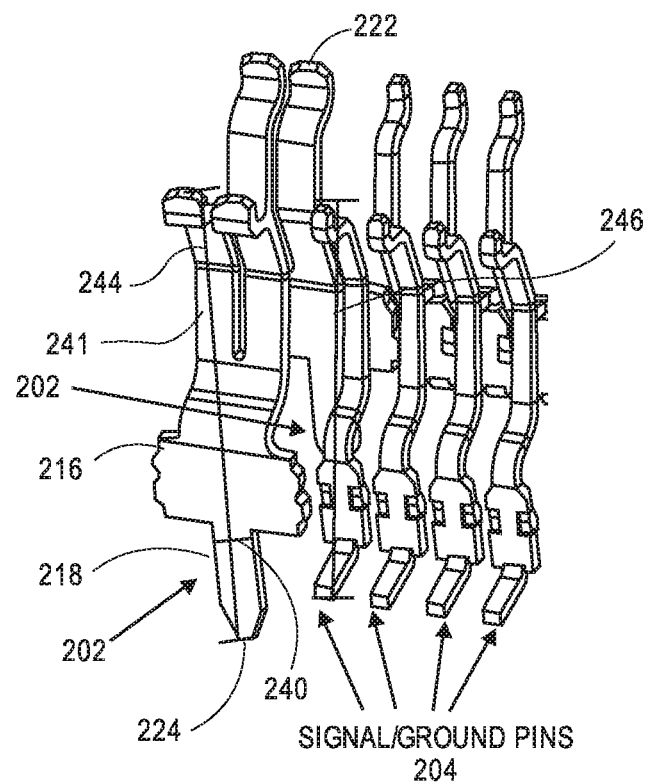
FIG. 2B illustrates a close-up view of the anchoring power pin of FIG. 2A, in accordance with an embodiment.

In one embodiment, a connector includes one or more anchoring power pins to provide power as well as act as an anchoring mechanism. In one such embodiment, a connector with such dedicated power pins enables the connector to conduct more current for higher power delivery, which also frees up more signal pins within the same connector length. An example of a connector with an anchoring power pin is illustrated in FIGS. 2A and 2B. FIG. 2A illustrates a portion of a connector with an anchoring power pin, in accordance with an embodiment. FIG. 2B illustrates a close-up view of an anchoring power pin of FIG. 2A, in accordance with an embodiment. Note that the housing of the connector is not illustrated in FIGS. 2A and 2B in order to better illustrate the anchoring power pins.

Referring to FIG. 2A, in one embodiment, a connector includes a plurality of pins 204 for transmitting signals. For example, the pins 204 can include pins for transmitting signals such as data (DQ) signals, command/address (C/A)

signals, and ground (GND). The connector includes separate anchoring power pins 202 for providing power and anchoring the connector to the circuit board. The connector is "anchored" to the circuit board when the connector is securely connected or attached to the circuit board. In one embodiment, the anchoring power pin 202 enables securely attaching the connector to the circuit board because the dimensions of the pin enable the pin to pass through a matching hole in the circuit board and withstand typical physical stress without deforming to securely hold the connector in position on the circuit board. In the illustrated embodiment, there are two opposing anchoring power pins 202 for making contact with both faces of a module (FIG. 2A illustrates one face 211 of the module 210). Anchoring power pins can be located at additional or different locations. For example, the connector can have similar anchoring power pins on its other end in addition to the anchoring power pins illustrated in Figure In one embodiment, the anchoring power pins 202 are located in a place where a mechanical anchoring mechanism would typically be located. However, a conventional mechanical anchoring mechanism does not conduct current and does not extend up to the memory module. Instead, a conventional mechanical anchoring mechanism terminates in the housing near the circuit board and is typically formed from a nonconductive material such as plastic (e.g., to avoid accidental shorts). In contrast, in one embodiment, the anchoring power pin 202 acts as a mechanical anchor, while also extending up to memory module to deliver power to the memory module 210.

The connector illustrated in FIGS. 2A and 2B includes signal pins 204 that are separate and different from the anchoring power pins 202. Although the pins 204 are sometimes referred to as "signal pins," the pins 204 can also include one or more ground pins in addition to pins for transmitting data signals and/or control signals. As mentioned above, in one embodiment, power is delivered to the module 210 via the separate anchoring power pins 202 instead of via the signal pins 204. Thus, a connector with dedicated anchoring power pins enables the signal pins 204 which would have traditionally been used to deliver power to be available for other purposes. However, in other embodiments, both an anchoring power pin and one or more signal pins can be used for the delivery of power.

Referring to the close-up view in FIG. 2B, the anchoring power pin has a module-contacting end 222 a circuit board-contacting end 224, and a "middle" region between the two ends 222, 224. In the illustrated embodiment, the middle region includes a portion 216 that secures or positions the anchoring power pin in the housing. The shape and dimensions of the portion 216 can be any shape and dimensions suitable for securing the anchoring power pin 202 in the housing. The top end 222 of a given one of the anchoring power pins 202 is to contact a corresponding contact 214 on the module 210. The end 222 of the anchoring power pins 202 can include spring beams to exert force on the contacts 214 when the module 210 is seated in the connector. In one embodiment, the spring beams of the anchoring power pins 202 have a similar shape and length as the spring beams of the signal pins 204, but are larger in size to maximize contact force and increase electrical conductivity. In one embodiment, the top end 222 of the anchoring power pins 202 are "Y" shaped spring beams to increase the potential contact area between the anchoring power pins 202 and the contacts 214.

The bottom end 224 of the anchoring power pin 202 includes a protruding portion or tip to be inserted into a through hole on a circuit board, in accordance with an embodiment. FIG. 3A depicts a circuit board with through holes for the anchoring power pin. The shape and dimensions of the portion 224 that contacts and passes through the circuit board can be any suitable size or shape such that portion can conduct sufficient current and/or be sufficiently rigid or strong to provide an anchoring mechanism for the connector. In one embodiment, the cross section 240 of the portion 224 is optimized (e.g., large relative to the signal pin width) to enable low resistance and high conductivity in the anchoring power pin 202, as well as physical strength for anchoring the connector. In one embodiment, the tip of the anchoring power pin is shaped like a blade or spike. In one such embodiment, the anchoring power pin has a tapered tip. In one such embodiment, the anchoring power pin is a "power blade pin" that delivers power and is shaped like a blade to anchor the connector to a circuit board. The illustrated example is one example of a blade-shaped anchoring power pin that has a tapered tip. Thus, although the description refers generally to an anchoring power pin, the references and description related to an anchoring power pin also applies to a "power blade" or "power blade pin." A tapered tip can facilitate installation of the connector onto the circuit board due to ease of insertion into matching holes on the circuit board.

As mentioned above, the length 244 of the anchoring power pin can be optimized to, for example, increase current delivery and/or to physically anchor the connector to a circuit. For example, an anchoring power pin that is long enough to pass through the entire thickness (or a majority of) the circuit board improves power delivery due to increased surface area. A power pin that is long enough to enter a through hole in the circuit board can also enable the power pin to act as an anchor. According to embodiments, the tip of the anchoring power pin can partially or completely pass through the circuit board. In one such embodiment, solder in and around a through hole surrounding the anchoring power pin can provide additional anchoring support to the anchoring power pin. In an embodiment in which the tip of the anchoring power pin completely passes through the circuit board, the tip of the anchoring power pin may or may not extend out the other side of the circuit board. In one example, the tip of the anchoring power pin that passes through the circuit board is at least as long as the thickness of the circuit board (e.g., at least as long as the length of the through matching hole in the circuit board). In one embodiment, the tip of the anchoring power pin that passes through the circuit board is longer than the thickness of the circuit board (e.g., longer than the length of the matching through hole in the circuit board). In one embodiment, the length of the portion of the power pin that is external to the housing (e.g., the length of the portion of the power pin that passes through the circuit board) is approximately 2-3 mm. However, the length of the power pin that passes through the circuit board can be less than 2 mm or greater than 3 mm.

In contrast to the anchoring power pins, the signal pins 204 are typically smaller (e.g., in length and/or width) to minimize electromagnetic coupling between pins, and to maximize the number of pins on the module (e.g., enable a high pitch). For example, in one embodiment, the signal pins are limited in length and width to avoid electromagnetic coupling between adjacent signal pins. The small width also enables a larger number of signal pins 204, but results in relatively flimsy pins that are susceptible to deformation. In contrast, because the electromagnetic coupling concerns associated with high speed signal pins does not apply to pins used for power delivery, the anchoring power pin 202 can be substantially longer, wider, and/or thicker than the signal pins 204. The anchoring power pin 202 can be longer than the signal pins 204 at its module-contacting end 222, its circuit board-contacting end 224, or both. For example, the length 246 of the portion of the signal pins 204 that is external to the housing is less than the length 244 of the anchoring power pin that is external to the housing, in accordance with an embodiment. The length of the portion of the anchoring power pin 202 internal to the connector can also be longer than the signal pins 204. The width and/or thickness of the signal pins is also smaller than the width and/or thickness of the anchoring power pins, in accordance with embodiments. Because of the small size of the signal pins 204, the signal pins are not sufficiently strong to act as an anchoring mechanism without damaging or bending the signal pins, in accordance with an embodiment. Furthermore, the signal pins 204 are typically surface mount pins (e.g., the pins are coupled with the surface of the circuit board as opposed to passing through a hole in the circuit board) due to, e.g., the shorter length of the signal pins. Accordingly, the signal pins are unsuitable for use as an anchor.

Thus, the larger width and length of the anchoring power pin can enable significantly greater current, better connections, and stronger pins. In one embodiment, the current capability of each of the anchoring power pins 202 is ~5 A (amps). Some embodiments may require pins that conduct high current. For example, if conductive vias are located on the circuit board (but not on the modules), then the modules may operate at lower voltages, requiring a larger current to achieve the desired power. In other examples, conductive vias may be located on the modules (instead of the circuit boards), in which case the modules may operate at high voltages, and thus not require a large current to achieve the desired power. Regardless, anchoring power pins can be used to deliver power with fewer pins compared to the smaller signal pins, in accordance with embodiments. In one such embodiment, if the pins 204 were used to delivery power, many (e.g., 5, 6, or more) of the pins 204 would be reserved for power. In contrast, in one embodiment, all of the pins 204 can be available for signals or ground and the power pins 202 provide power. In one embodiment with 6 anchoring power pins, the power delivery capacity of the anchoring power pins is equivalent to the power delivery capacity of 36 traditional signal pins.

In one embodiment, the distance or air gap between a given one of the signal pins 204 that is adjacent to a given one of the anchoring power pins 202 is approximately the same as the distance between adjacent signal pins 204. In one embodiment, a different pitch can be implemented (e.g., to avoid shorts). In one embodiment, the connector includes an insulative (e.g., plastic) barrier between a given anchoring power pin and signal pin. In one embodiment, the spacing, air gap, or insulative barrier can be used to reliably separate a high voltage power pin from the signal pins.

As illustrated in the embodiment of FIG. 2A, a connector can include one or more ejectors to enable ejecting a module. For example, the connector illustrated in FIG. 2A includes an ejector 206. Although only one end of the connector is illustrated, in one embodiment, the connector has ejectors on both ends (e.g., as illustrated in FIG. 3C, discussed below). The ejector 206 is shown in an "eject" or "ejected" position. In the ejected position, the "top" end 230 of the ejector 206 moves or rotates away from the module 210, and the "bottom" end 232 moves or rotates towards the module 210. Note that the terms "top," "bottom," and other terms of orientation are used for illustrative purposes and are not intended to be limiting. By moving or rotating inwards towards the module, the bottom end 232 of the ejector 206 applies upward pressure (e.g., in the positive z-direction as illustrated in FIG. 2A) to the bottom edge 234 of the module 210 to push the module 210 out of the connector. When the module 210 is inserted into the connector (e.g., inserted into a "slot" or "opening" between the rows of opposing pins 204 of the connector), the module 210 applies downward pressure (e.g., pressure in the negative z-direction as illustrated in FIG. 2A) to the ejector to cause the top end 230 of the ejector 206 to move or rotate inwards towards the module 210, and the bottom end 232 of the ejector 206 to move outwards away from the module 210. When the module 210 is installed or inserted into the connector it is "seated" and the ejector is in a "seated" position. When the ejector 206 is in a seated position, in one embodiment, the ejector contacts the side edges 236 of the module 210. In one such embodiment, the ejector 206 secures or "locks" the module 210 into its seated position.

In one embodiment, the anchoring power pin can occupy the traditionally empty region 220 on a module 210 (e.g., region 104 of FIG. 1A) that is reserved to prevent interference from the ejector 206. Therefore, the anchoring power pins 202 does not take the place of existing pins 204, and no extra space on the module is needed for the corresponding power contacts, in accordance with an embodiment. On the contrary, a connector that includes an anchoring power pin can free up multiple pins (e.g., one or more of the pins 204) that would have been used for power delivery for use as additional signal pins.

In one embodiment, the connector includes an anchoring power pin with dimensions and a position relative to an ejector to avoid interference from the movement of the ejector. For example, in one embodiment, the dimensions of the anchoring power pins 202 enable the ejector 206 to swing or rotate in between the two opposing anchoring power pins 202 when in an ejected position as illustrated in FIG. 2A. For example, because the anchoring power pins 202 can be longer than the signal pins 204, the opposing anchoring power pins 202 can be separated by a distance sufficient to allow the bottom end 232 of the ejector 206 to pass between the opposing anchoring power pins when in an ejected position. Thus, in one embodiment, the distance or spacing between opposing anchoring power pins is greater than the width of the bottom end 232 of the ejector 206 that moves towards the connector. The dimensions of the ejector and the spacing between the anchoring power pins are better illustrated in FIG. 4F, discussed below. In one embodiment, the anchoring power pins 202 flare out (e.g., the distance between the pins at the bottom end 218 is greater than the distance between the pins at their mid region (e.g., the portion 216) or top end 222) to enable the bottom end 232 of the ejector 206 to pass between the pins.

Thus, in one embodiment, the anchoring power pins 202 straddle the ejector 206 when in an ejected position. In one embodiment, although the distance between the anchoring power pins 202 is sufficient to enable the ejector to pass between the pins, the ejector contacts the anchoring power pins 202 when in the ejected position. For example, the ejector 206 may apply pressure to a portion (e.g., portion 241) of the anchoring power pin. However, in one embodiment, due to the larger size (e.g., thickness and/or width) of the anchoring power pin, the anchoring power pin 202 is sufficiently strong and elastic so that pressure from the ejector does not irreversibly damage or deform the anchoring power pin 202. In contrast, if the ejector applied pressure to the signal pins 204, the signal pins 204 may deform and become misaligned, resulting in electrical shorts or unconnected pins when the module is seated. Therefore, the anchoring power pins 202 can be located in a region that the signal pins cannot traditionally be located due to potential interference from the ejectors 206.

Accordingly, unlike the signal pins 204, the length of the anchoring power pin 202 enables the anchoring power pin to act as a mechanical anchor as well as a power pin, and can further enable the anchoring power pin to occupy a region on the connector that is traditionally unavailable for pins. In one such embodiment, a connector can replace the conventional mechanical anchors (such as the anchors 114 of FIG. 1B) with anchoring power pins. In another embodiment, a connector includes a combination of anchoring power pins and conventional anchors. Although FIGS. 2A and 2B illustrate an anchoring power pin at one end of a connector, an anchoring power pin in the central region of a connector can be the same as or similar to the anchoring power pin discussed with respect to FIGS. 2A and 2B. Furthermore, although the anchoring power pins illustrated in FIGS. 2A and 2B are located in regions that are typically occupied by conventional anchoring mechanisms, anchoring power pins can be located at any location on the connector. Note that although FIGS. 2A and 2B discuss the dimension of the pins in terms of "width" and "thickness," suggesting a non-circular cross section, embodiments can include pins having cross-sections of a variety of shapes and dimensions, including round (e.g., circular), rectangular, or other cross-section shapes.

Figure 3B:
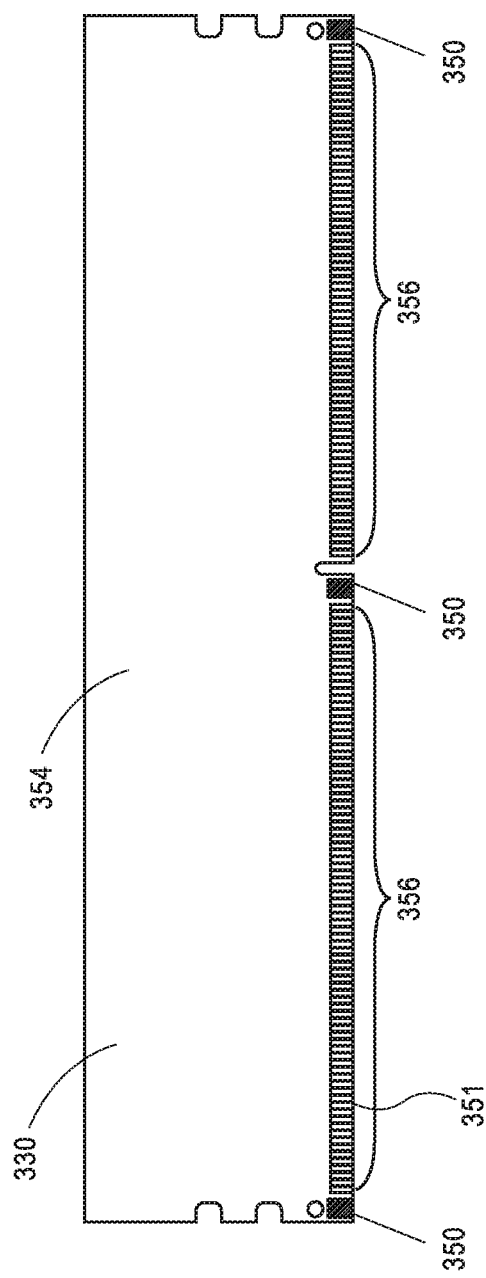
FIG. 3B illustrates a memory module that can be installed in a connector with an anchoring power pin, in accordance with an embodiment.
Figure 3C:
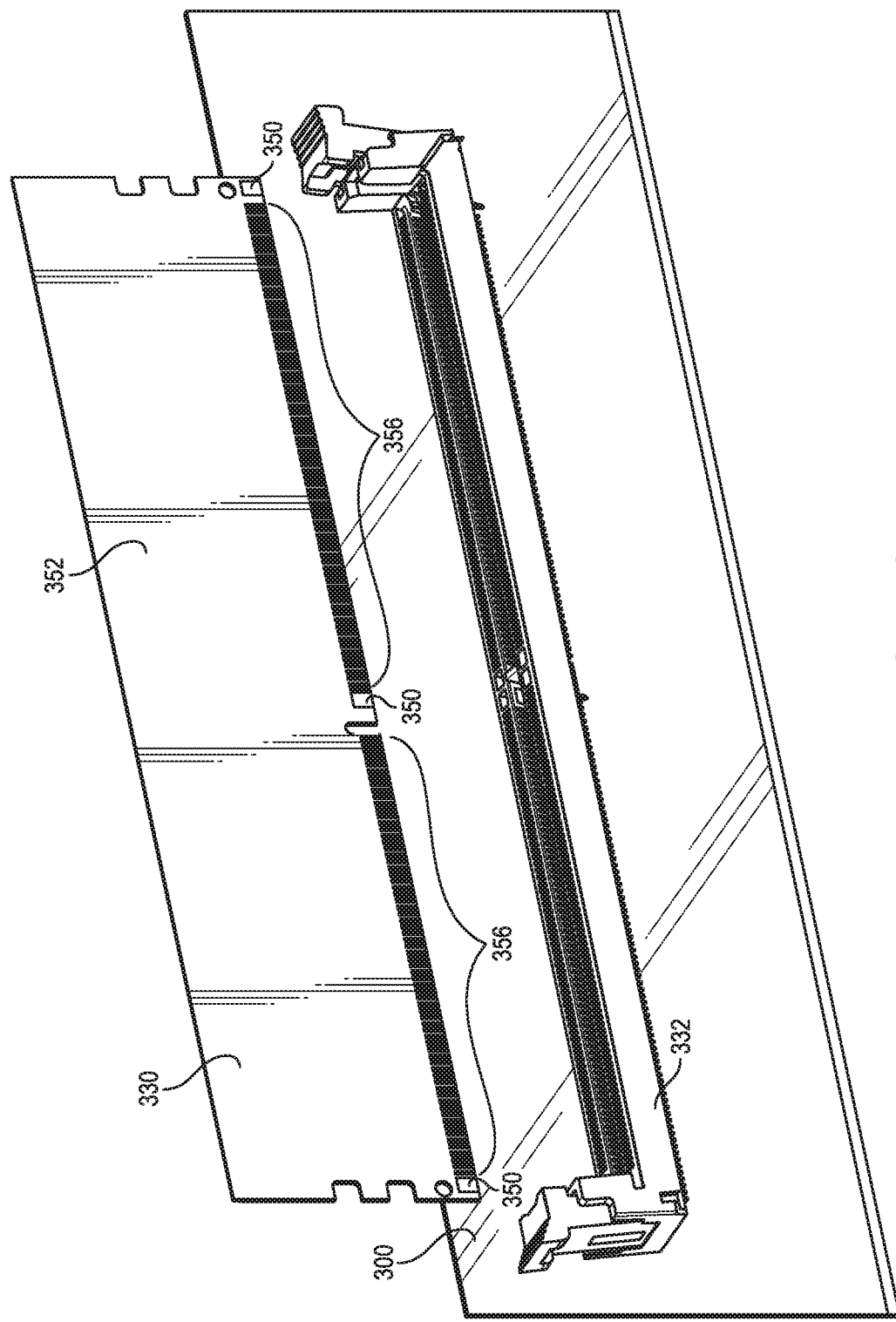
FIG. 3C illustrates the circuit board of FIG. 3A with the connector installed and a module to be installed, in accordance with an embodiment.

FIG. 3A illustrates a circuit board onto which a connector having an anchoring power pin can be installed, in accordance with an embodiment. FIG. 3B illustrates a memory module that can be installed in a connector with an anchoring power pin, in accordance with an embodiment. FIG. 3C illustrates the circuit board of FIG. 3A with the connector installed, in accordance with an embodiment. Referring to FIG. 3A, in one embodiment, the circuit board 300 includes a substrate 301 upon which electronic components can be mounted and coupled with one another. The circuit board 300 includes conductive contacts (e.g., conductive tracks, pads, pins, wires, traces, or other conductive contacts) to electrically couple components and provide power to components. Components can be attached (e.g., soldered) onto the board or embedded in the circuit board 300.

In the embodiment illustrated in FIG. 3A, the circuit board 300 includes rows or arrays 310 of pads 306 and through holes 304 for supporting a connector such as the connector illustrated in FIG. 2A. A magnified view 302 shows the individual surface-mount technology (SMT) pads 306 for coupling with signal pins (e.g., the signal pins 204 of FIG. 2A) and plated through holes (PTHs) 304 for coupling with anchoring power pins (e.g., the anchoring power pin 202 of FIG. 2A), in accordance with an embodiment. Through holes are holes formed in the circuit board. Through holes can be plated with a conductive material with which the anchoring power pins and solder electrically couple. As discussed above, when a connector is installed on the circuit board 300, in one embodiment, the anchoring power pins are disposed in the through holes 304, while the signal (or ground) pins contact the surface-mounted pads 306 without passing through the circuit board 300. The conductive power pins can partially or completely pass through the through holes 304. In one embodiment, circuit board 300 is a multilayer printed circuit board (PCB), which can include one or more ground layers, one or more power layers, or both. In such an embodiment, PTHs 304 can provide connection of power blade pins directly to the power layer or ground layer, or both. The holes 304 can be referred to as "matching holes" for the conductive power pins. A matching hold for the conductive power pin is a hole that has dimensions and/or other attributes to enable mating with or coupling with the conductive power pin. For example, the diameter of the holes can be sufficiently large to enable the power pin to be inserted into the hole and to further enable soldering, but small enough to provide mechanical support and anchor the connector.

FIG. 3B illustrates a memory module 330 that can be installed in a connector with an anchoring power pin, in accordance with an embodiment. The memory module 330 includes memory resources (e.g., arrays of memory cells, which are not shown in FIG. 3B) to store information. The memory module 330 includes pads 350 and 356 on its face 354 near its bottom edge 351. The pads 350 are for coupling with anchoring power pins and the pads 356 for coupling with signal pins, in accordance with an embodiment. In the illustrated embodiment, the pads 350 to couple with the anchoring power pins are larger than the pads 356 to couple with signal pins. In one embodiment, the distance or spacing between the pads 356 and the pads 350 is approximately the same. In other embodiments, the pads 350 to couple with the anchoring power pins are located at a distance from the pads 356 for the signal pins that is greater than the distance between a given two pads 356. The pads 350 for coupling with anchoring power pins such as described herein are located on the module 354 to correspond to the locations of the anchoring power pins, in accordance with embodiments. Thus, although there are three pads 350 on each face in the example of FIG. 3B, a module can include more or fewer pads for coupling with anchoring power pins. Although the module 330 illustrated in FIG. 3B is a memory module, connectors with anchoring power pins can be used to couple with other modules, such as graphics cards, sound cards, or other cards or modules to be installed in a computer system with a connector.

FIG. 3C illustrates the circuit board 300 with a connector 332 installed on the circuit board 300, as well as a module 330 to be seated in the connector 332, in accordance with an embodiment. Note that in comparison to FIG. 3B, the opposite face 352 of the module 330 is illustrated in FIG. 3C. In one embodiment, the module 330 includes pads 356 for coupling with signal pins and pads 350 for coupling with anchoring power pins on both faces 354, 352. In one embodiment, the connector 332 is a DDR5 (double data rate fifth generation random access memory, currently in discussion by JEDEC, the Joint Electron Device Engineering Council) connector and the module is a DDR5 module. The connector 332 can also be a connector for future revisions of or updates to JEDEC DDR (double data rate) standards.

FIGS. 4A-4I illustrate different views of a connector with an anchoring power pin, in accordance with an embodiment.

Figure 4A:
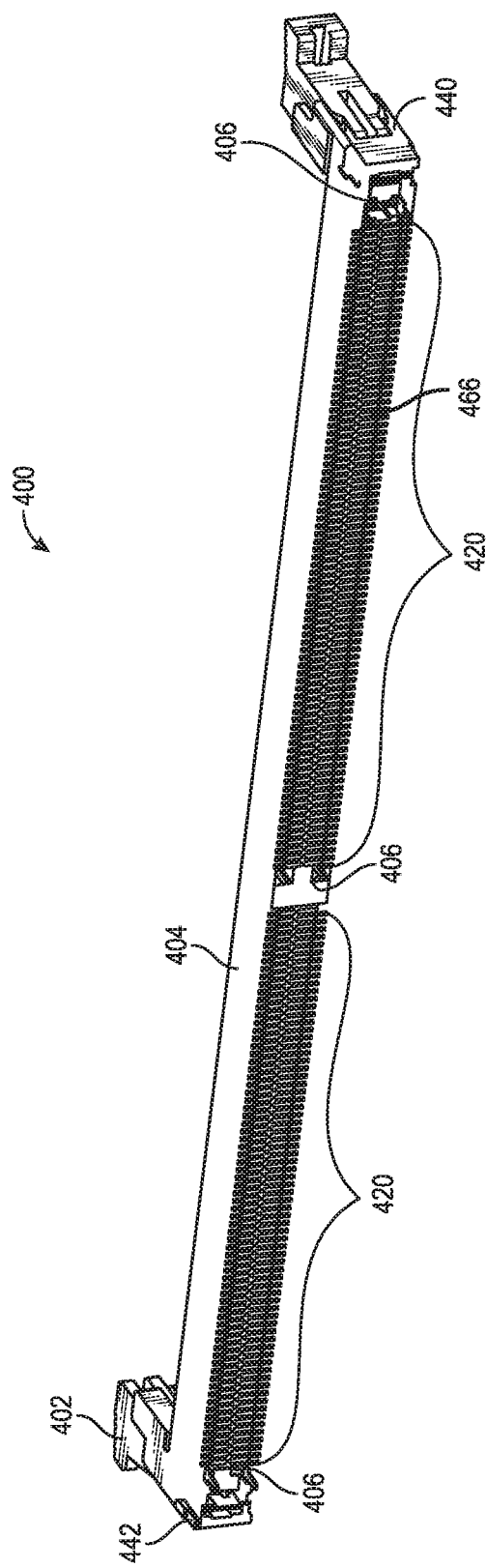
FIG. 4A illustrates a connector with an anchoring power pin, in accordance with an embodiment.
Figure 4B:
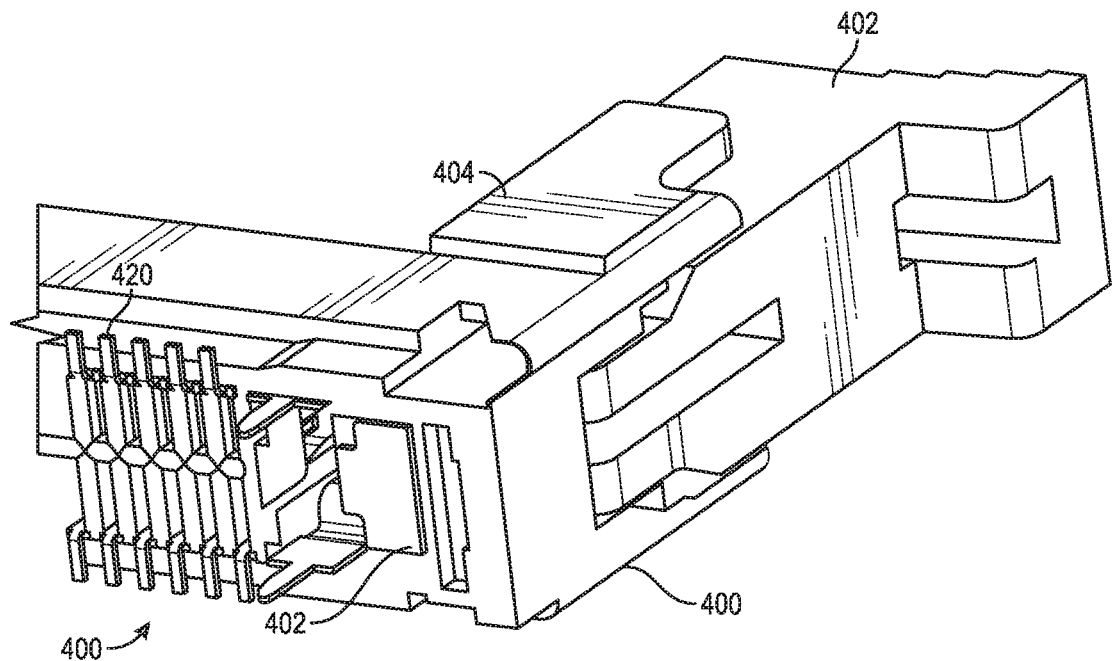
FIG. 4B illustrates a close-up view of the connector of FIG. 4A, in accordance with an embodiment.

Referring to FIGS. 4A and 4B, the illustrated connector is similar to the connector of FIG. 2A, but with the housing illustrated. FIG. 4B is a close up view of one end of the connector illustrated in FIG. 4A.

The connector 400 includes a housing 404 to align and contain the pins of the connector 400. The housing 404 is typically a rigid nonconductive material such as a plastic or other nonconductive material. The housing houses pins 420 (e.g., signal and/or ground pins such as the pins 204 of FIG. 2A) and anchoring power pins 406 (such as the anchoring power pins 202 of FIG. 2A). Pins are "housed" by housing if they are located in the housing, physically supported or secured by the housing, or both. In the illustrated example, the housing 404 includes an elongated body with two ends 440 and 442. The housing 404 has a circuit board-facing side 466 to face or interface with the circuit board, and a module-facing side 468 (FIG. 4D) to face or interface with the module. Thus, the circuit board-facing side 403 could be referred to as the "bottom side" of the connector and the module-facing side could be referred to as the "top side" of the connector. The bottom side of connector is typically physically and electrically coupled with a circuit board, and a module can be installed into a slot on the top side of the connector. The connector also includes an ejector 402 at its ends 440 and 442 to facilitate ejection or removal of the module after installation. The ejector 402 can be the same or similar as the ejector 206 of FIG. 2A.

The connector 400 also includes both signal pins 420 and anchoring power pins 406. As can be seen in FIG. 4B, the signal pins 420 are to be surface mounted, and are thus "flat" or parallel relative to a surface of a circuit board onto which the connector 400 is to be installed (e.g., the circuit board 300 of FIG. 3A). In contrast, the illustrated anchoring power pins 406 are perpendicular (orthogonal) relative to the surface of the circuit board with which the connector is to be coupled. The anchoring power pins 406 can also be orthogonal to the bottom side of housing. Unlike the signal pins 420, which are bent in order to be flat relative to the surface of the circuit board, the tips of the illustrated anchoring power pins are substantially straight to enable insertion into holes in the circuit board, in accordance with embodiments. Additionally, the signal pins 420 are short to avoid electromagnetic coupling between the pins. In contrast, the anchoring power pins 406 are longer than the signal pins and protrude from the housing for insertion into matching through holes on a circuit board. In one embodiment, the portion of the anchoring power pins that are external to the housing 404 is longer than portion of the signal pins that is external to the housing 404. The additional length can enable reflow soldering or other solder connection of anchoring power pins at least into a hole in a PCB to which the connector is mounted. In one embodiment, the anchoring power pins extend all the way through the PCB. Thus, in one embodiment, the anchoring power pins 406 include tips that protrude from the circuit board-facing side of the connector at an orthogonal angle relative to the circuit board to extend into matching holes in the circuit board. Therefore, the anchoring power pins 406 can both physically anchor the connector to the circuit board and electrically couple the module with the circuit board.

Figure 4C:
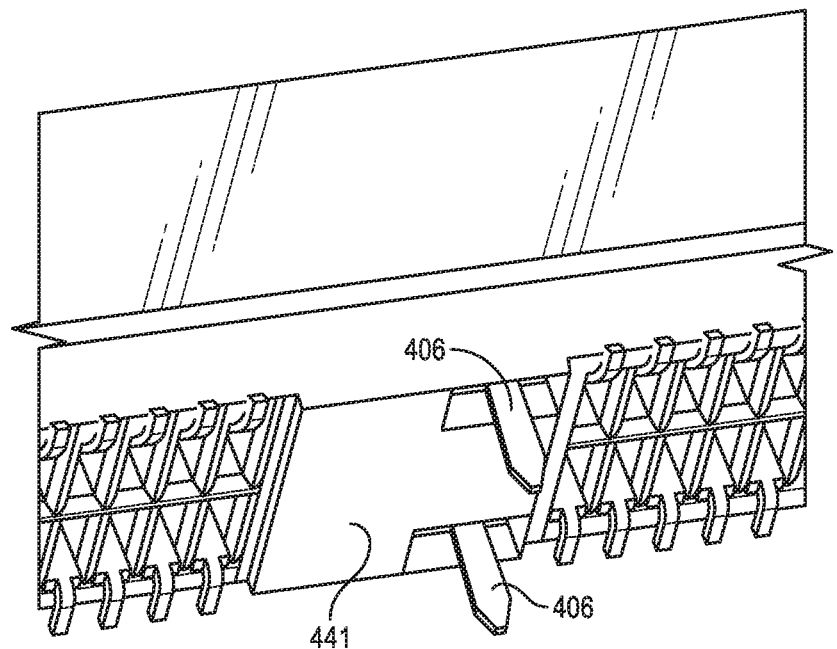
FIG. 4C illustrates another close-up view of the connector of FIG. 4A, in accordance with an embodiment.

FIG. 4C illustrates the middle (central) or key region of the bottom side of the connector 400, in accordance with an embodiment. In the illustrated embodiment, anchoring power pins are also placed in the key region 441. The key region includes features that can ensure a compatible device is installed in the connector, such as notches or other features. In one such embodiment, the anchoring power pins replace the mechanical retention hook that would typically be found in the key region 441. Thus, in one embodiment, no extra space no the connector is needed to implement the anchoring power pins, because the anchoring power pin can be located in a region that is typically not occupied by signal pins.

Figure 4D:
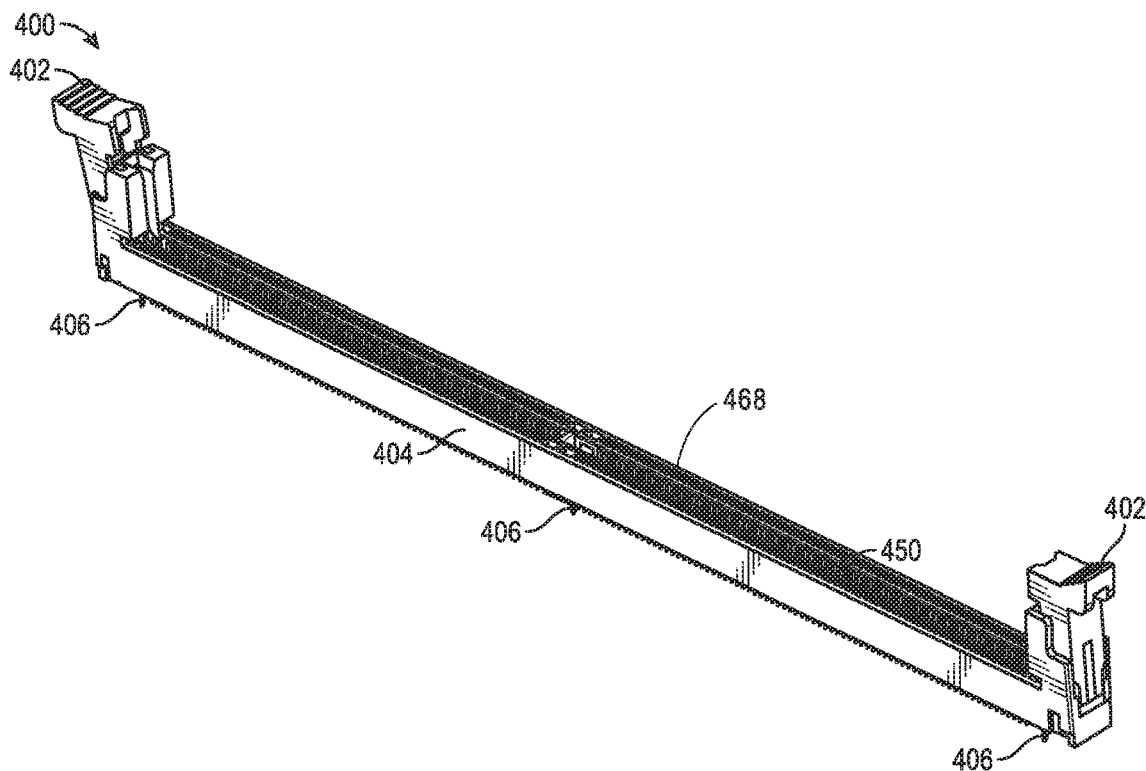
FIG. 4D illustrates a connector with an anchoring power pin, in accordance with an embodiment.
Figure 4E:
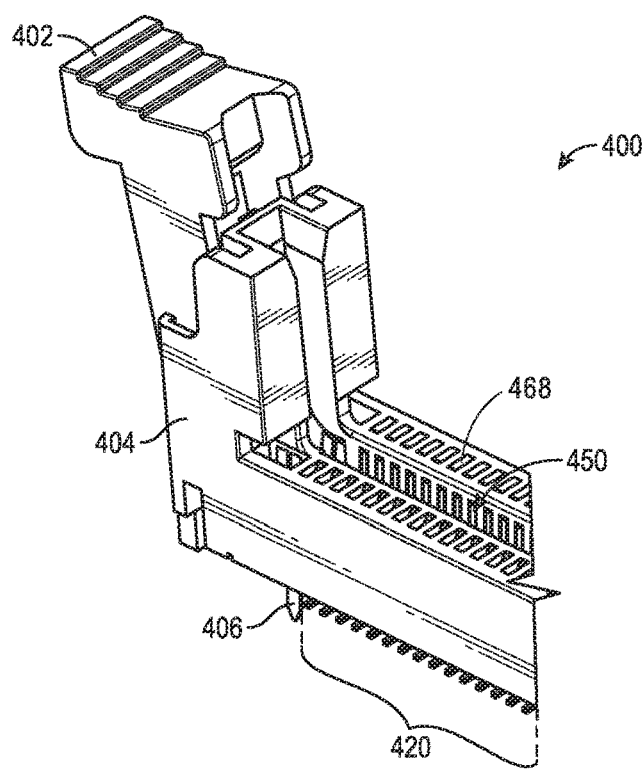
FIG. 4E illustrates a close-up view of the connector of FIG. 4A, in accordance with an embodiment.

FIGS. 4D and 4E illustrate the connector 400 from a different angle. In the view of FIGS. 4D and 4E, the slot 450 into which a module (e.g., the module 330 of FIG. 3B) is inserted is visible. The slot 450 is an opening or space between two opposing sets of pins to accept or receive a module, in accordance with an embodiment. FIG. 4E is a close up view of one end of the connector of FIG. 4D.

Figure 4F:
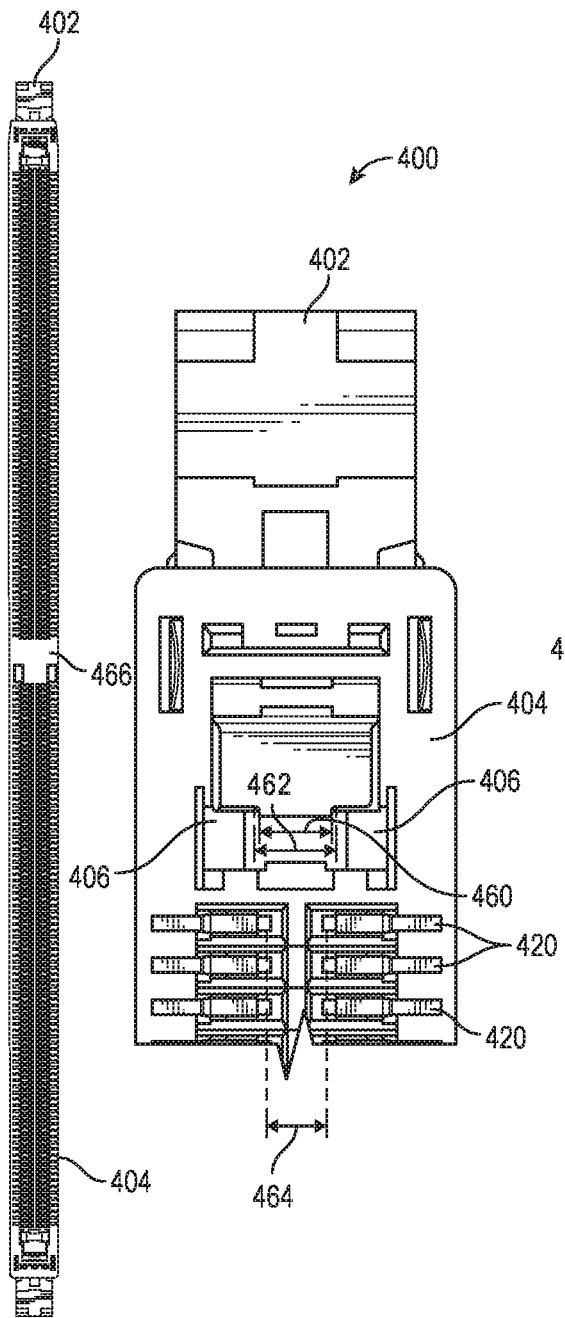
FIG. 4F illustrates a bottom view of the connector of FIG. 4A, in accordance with an embodiment.
Figure 4G:
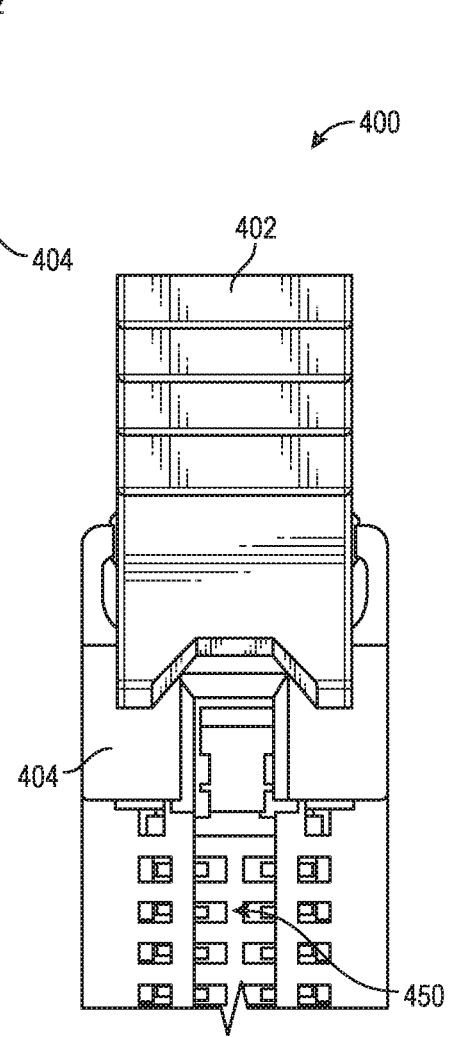
FIG. 4G illustrates a top view of the connector of FIG. 4A, in accordance with an embodiment.

FIGS. 4F and 4G illustrate top and bottom views of the connector 400, in accordance with an embodiment. FIG. 4F illustrates the connector 400 when viewed from its bottom, in accordance with an embodiment. The bottom side 466 of the connector is to couple with and physically contact a circuit board, in accordance with an embodiment. The connector 400 can be secured to the circuit board with the anchoring power pins 406, other anchoring mechanisms, solder, or a combination, in accordance to embodiments. In one embodiments, the anchoring power pins protrude from the housing 404 on the bottom side 466 of the connector to mate or couple with a corresponding or matching hole in the circuit board. In contrast, the signal pins 420 are bent to enable surface mounting on the circuit board, and do not pass through the circuit board, in accordance with an embodiment. As mentioned above, in one embodiment, due to the longer length of the anchoring power pins, the anchoring power pins 406 are able to be spaced further apart than the signal pins 420. The anchoring power pins can be closer together in and near the housing, and flare out at the tips. For example, the distance 460 between opposing power pins 406 in or near the housing can be smaller than the distance 462 between opposing power pins 406 at their tips. Thus, in the illustrated example, the distance 464 between the opposing signal pins 420 is smaller than the distance 462 between opposing power pins 406 at their tips. As mentioned above, the length of the anchoring power pins and the distance between opposing power pins in part enable the anchoring power pins to be located next to the ejectors 402.

FIG. 4G illustrates the connector 400 from its top, in accordance with an embodiment. The slot 450 of the connector for accepting a module can be seen from the top view. In one embodiment, the signal pins 420 and the anchoring power pins 406 are contained in the housing at the top side 468 of the connector. A module inserted into the slot 450 contacts the signal pins and the anchoring power pin in the housing, in accordance with an embodiment.

Figure 4I:
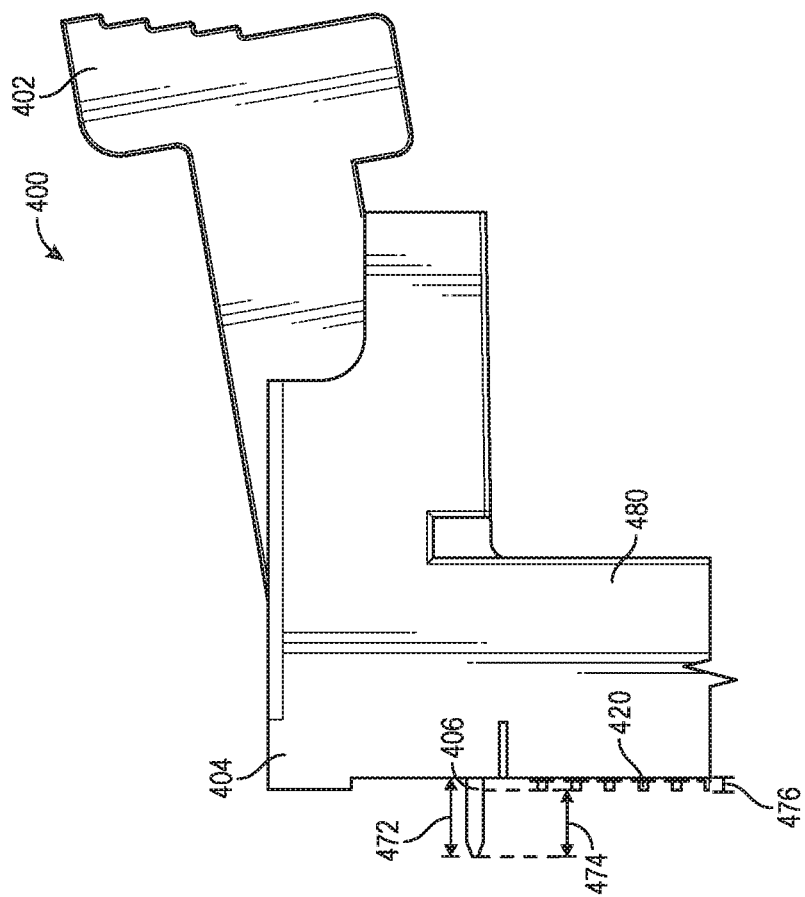
FIG. 4I illustrates a close up side view of the connector of FIG. 4A, in accordance with an embodiment.
Figure 4H:
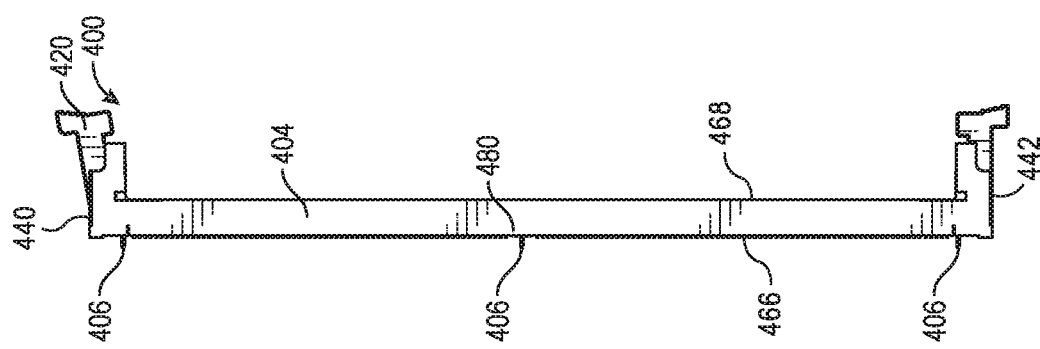
FIG. 4H illustrates a side view of the connector of FIG. 4A, in accordance with an embodiment.

FIGS. 4H and 4I illustrate the connector 400 from a side view, in accordance with an embodiment. As can be seen in FIGS. 4H and 4I, in one embodiment, the anchoring power pins 406 protrude from or extend from the housing 404 of the connector 400. In one embodiment, the length 472 of the portion of the anchoring power pins 406 external to the housing 404 is substantially larger than the length 476 of the portion of the signal pins 420 external to the housing (as shown by the difference 474). In one embodiment, the length 476 is sufficiently long to pass through (completely or partially through) a matching hole in the circuit board with which the connector 400 is coupled. Although the side opposite to the side 480 is not shown, the side opposite to the side 480 can be the same or similar to the side 480 described above.

Note that although FIGS. 4A-4I illustrate a particular shape and orientation of the anchoring power pin, other shapes, orientations, and numbers of power pins are possible. For example, in embodiments, a connector can include one or more anchoring power pins. In one such example, a connector includes anchoring power pins on the two sides near the ejectors, but not in the key region. In another embodiment, one or more anchoring power pins are included in the key region. Furthermore, different orientations are possible. For example, although FIG. 4I illustrates anchoring power pins that are straight or flat along the page, the power pins can be rotated to cut into the page, may be round. Anchoring power pins may be straight or have regions that are not straight (e.g., protuberances, bends, or bulges, or other non-straight features), or can have any other orientation or shape that enables both sufficient current delivery and mechanical retention. Additionally, anchoring power pins are illustrated as having a specific size (length, width, and thickness) as an example, however, anchoring power pins can be smaller or larger than the anchoring power pins illustrated. Larger anchoring power pins can have the benefit of higher conductivity.

Figure 5:
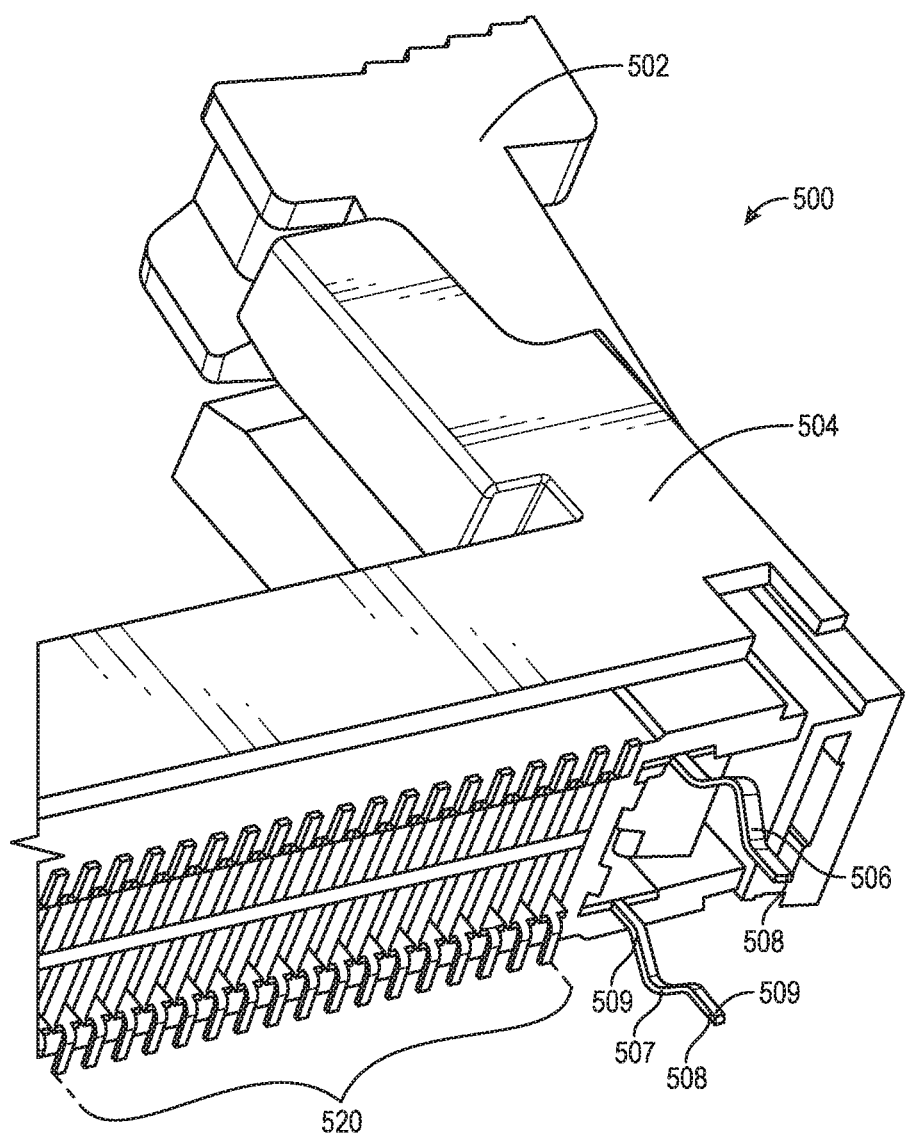
FIG. 5 is a connector with an anchoring power pin, in accordance with another embodiment.

FIG. 5 is a connector with an anchoring power pin, in accordance with another embodiment. Like the connector 400 of FIG. 4A, the connector 500 of FIG. 5 includes housing 504, a plurality of signal pins 520, an ejector 502, and anchoring power pins 506. However, the anchoring power pins 506 of FIG. 5 are shaped like a fork with two tines or prongs 508. In the illustrated example, each anchoring power pin 506 has a mid section that is not straight, and which can be described as a bulge, bend, or protuberance. The illustrated anchoring power pins each have a tip (e.g., the tip that are external to the housing 504), with a protruding section 507 between two straight sections 509. Other embodiments could include one or more non-straight sections (e.g., one or more non-straight sections such as protruding section 507). In the illustrated example, the protruding sections 507 of the two anchoring power pins 506 protrude away from one another. The shape of the power pins 506 enable the pins 506 to act as a fork lock, in accordance with an embodiment. In one such embodiment, the anchoring power pins 506 are a fork lock that, when inserted into the circuit board, the prongs of the fork expand and lock into place. The power pins 506 of FIG. 5 could also be referred to as an expanding clip or barb that opens up and locks into the circuit board. Unlike conventional connectors that include fork-shaped retention mechanisms, the anchoring power pin 506 is conductive and delivers power in addition to anchoring the connector 500 to the circuit board.

Thus, FIGS. 2A-5 illustrate examples of anchoring power pins in accordance with an embodiment. Although this description refers to memory modules for illustrative purposes, other embodiments include anchoring power pins for other computer applications (e.g., cards such as graphic cards, sound cards, or other modules or cards that couple with a circuit board via a connector). Additionally, although the "signal pins" are referred to as pins for transmitting signals and/or grounding the module, in some embodiments, one or more of the "signal pins" can be used to provide power to the module regardless of whether a dedicated anchoring power pin is provided.

Figure 6:
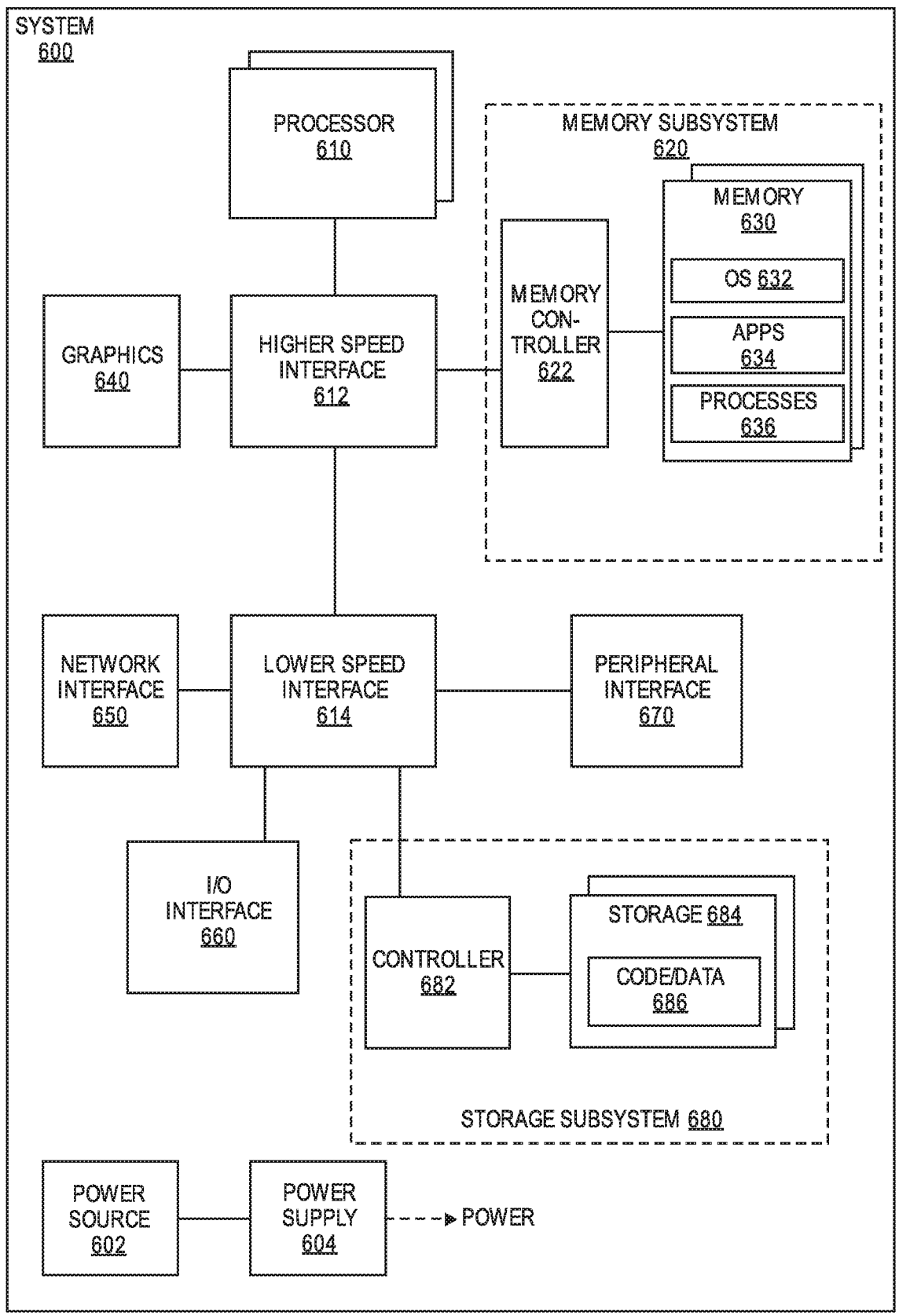
FIG. 6 is a block diagram of a computing system in which a connector with an anchoring power pin can be included, in accordance with an embodiment.

FIG. 6 is a block diagram of a computing system in which a connector with an anchoring power pin can be included, in accordance with an embodiment.

System 600 represents a computing device in accordance with any embodiment described herein, and can be a laptop computer, a desktop computer, a server, a gaming or entertainment control system, a scanner, copier, printer, routing or switching device, embedded computing device, or other electronic device.

System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 600 includes interface 612 coupled to processor 610, which can represent a higher speed interface or a high throughput interface for system components that needs higher bandwidth connections, such as memory subsystem 620 or graphics interface components 640. Interface 612 can represent a "north bridge" circuit, which can be a standalone component or integrated onto a processor die. Graphics interface 640 interfaces to graphics components for providing a visual display to a user of system 600. In one embodiment, graphics interface 640 generates a display based on data stored in memory 630 or based on operations executed by processor 610 or both.

Memory subsystem 620 represents the main memory of system 600, and provides storage for code to be executed by processor 610, or data values to be used in executing a routine. Memory subsystem 620 can include one or more memory devices 630 such as read-only memory (ROM), flash memory, one or more varieties of random access memory (RAM), or other memory devices, or a combination of such devices.

Memory 630 stores and hosts, among other things, operating system (OS) 632 to provide a software platform for execution of instructions in system 600. Additionally, applications 634 can execute on the software platform of OS 632 from memory 630.

Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide logic to provide functions for system 600. In one embodiment, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 600 includes interface 614, which can be coupled to interface 612. Interface 614 can be a lower speed interface than interface 612. In one embodiment, interface 614 can be a "south bridge" circuit, which can include standalone components and integrated circuitry. In one embodiment, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, USB (universal serial bus), or other wired or wireless standards-based or proprietary interfaces. Network interface 650 can exchange data with a remote device, which can include sending data stored in memory or receiving data to be stored in memory.

In one embodiment, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one embodiment, system 600 includes storage subsystem 680 to store data in a nonvolatile manner. In one embodiment, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data 686 in a persistent state (i.e., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (i.e., the value or state of the data is indeterminate if power is interrupted to system 600). In one embodiment, storage subsystem 680 includes controller 682 to interface with storage 684. In one embodiment controller 682 is a physical part of interface 614 or processor 610, or can include circuits or logic in both processor 610 and interface 614.

Power source 602 provides power to the components of system 600. More specifically, power source 602 typically interfaces to one or multiple power supplies 604 in system 600 to provide power to the components of system 600. In one embodiment, power supply 604 includes an AC to DC (alternating current to direct current) adapter to plug into a wall outlet. Such AC power can be renewable energy (e.g., solar power) power source 602. In one embodiment, power source 602 includes a DC power source, such as an external AC to DC converter. In one embodiment, power source 602 or power supply 604 includes wireless charging hardware to charge via proximity to a charging field. In one embodiment, power source 602 can include an internal battery or fuel cell source.

Figure 7:
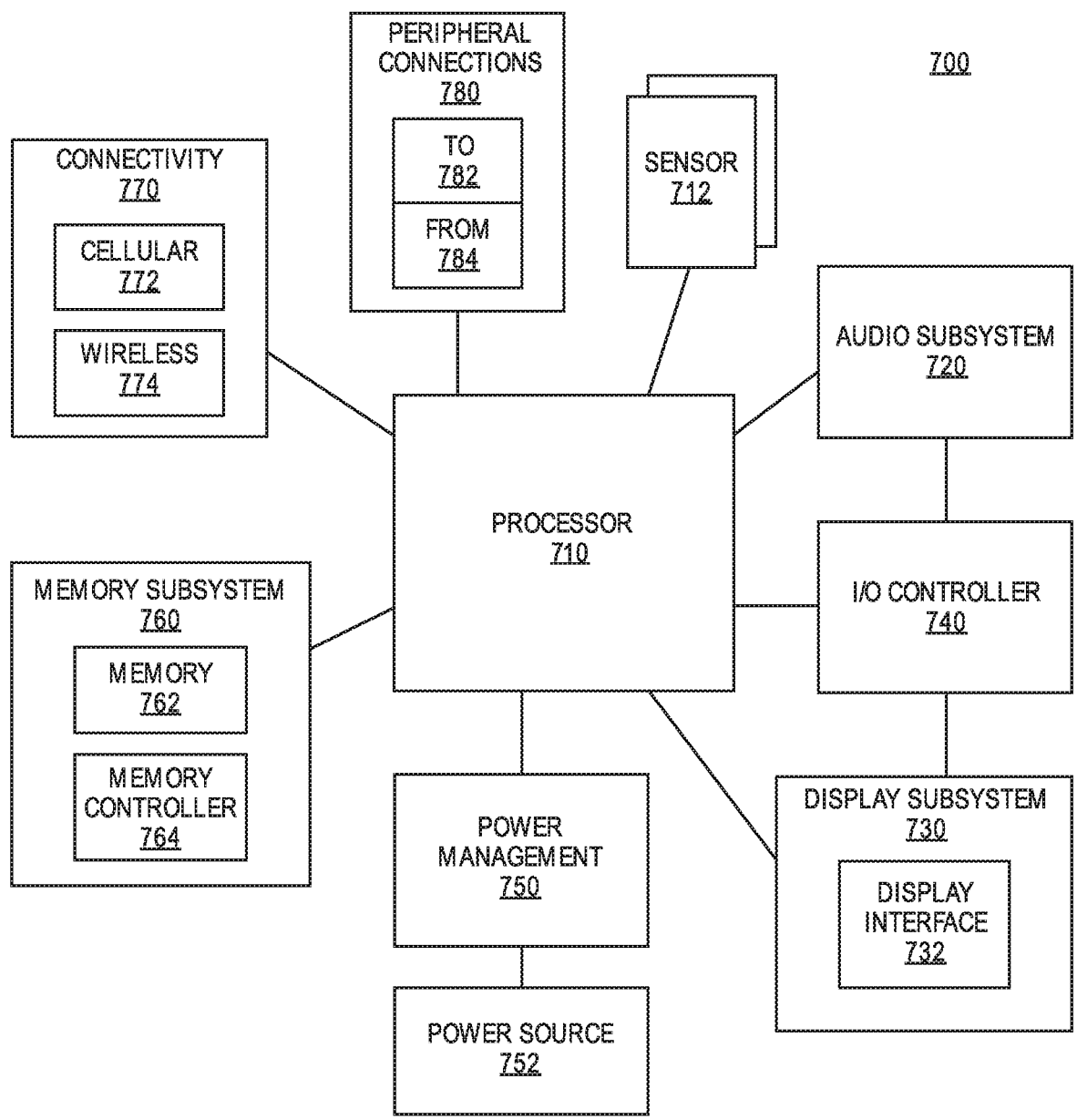
FIG. 7 is a block diagram of a mobile device in which a connector with an anchoring power pin can be included, in accordance with an embodiment.

FIG. 7 is a block diagram of a mobile device in which a connector with an anchoring power pin can be included, in accordance with an embodiment. Device 700 represents a mobile computing device, such as a computing tablet, a mobile phone or smartphone, a wireless-enabled e-reader, wearable computing device, or other mobile device, or an embedded computing device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and device functions are executed. The processing operations include operations related to I/O (input/output) with a human user or with other devices, operations related to power management, operations related to connecting device 700 to another device, or a combination. The processing operations can also include operations related to audio I/O, display I/O, or other interfacing, or a combination. Processor 710 can execute data stored in memory. Processor 710 can write or edit data stored in memory.

In one embodiment, system 700 includes one or more sensors 712. Sensors 712 represent embedded sensors or interfaces to external sensors, or a combination. Sensors 712 enable system 700 to monitor or detect one or more conditions of an environment or a device in which system 700 is implemented. Sensors 712 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, glucose monitors, or other sensors to detect medical or physiological attributes), or other sensors, or a combination. Sensors 712 can also include sensors for biometric systems such as fingerprint detectors, face detection or recognition systems, or other systems that detect or recognize user features. Sensors 712 should be understood broadly, and not limiting on the many different types of sensors that could be implemented with system 700. In one embodiment, one or more sensors 712 couples to processor 710 via a frontend circuit integrated with processor 710. In one embodiment, one or more sensors 712 couples to processor 710 via another component of system 700.

In one embodiment, device 700 includes audio subsystem 720, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software components (e.g., drivers) that provide a visual display for presentation to a user. In one embodiment, the display includes tactile components or touchscreen elements for a user to interact with the computing device. Display subsystem 730 includes display interface 732, which includes the particular screen or hardware device used to provide a display to a user. In one embodiment, display interface 732 includes logic separate from processor 710 (such as a graphics processor) to perform at least some processing related to the display. In one embodiment, display subsystem 730 includes a touchscreen device that provides both output and input to a user. In one embodiment, display subsystem 730 includes a high definition (HD) display that provides an output to a user. High definition can refer to a display having a pixel density of approximately 100 PPI (pixels per inch) or greater, and can include formats such as full HD (e.g., 1080*p*), retina displays, 4K (ultra high definition or UHD), or others. In one embodiment, display subsystem 730 generates display information based on data stored in memory and operations executed by processor 710.

I/O controller 740 represents hardware devices and software components related to interaction with a user. I/O controller 740 can operate to manage hardware that is part of audio subsystem 720, or display subsystem 730, or both. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 or display subsystem 730 or both. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as sensors 712, accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features).

In one embodiment, device 700 includes power management 750 that manages battery power usage, charging of the battery, and features related to power saving operation. Power management 750 manages power from power source 752, which provides power to the components of system 700. In one embodiment, power source 752 includes an AC to DC (alternating current to direct current) adapter to plug into a wall outlet. Such AC power can be renewable energy (e.g., solar power, motion based power). In one embodiment, power source 752 includes only DC power, which can be provided by a DC power source, such as an external AC to DC converter. In one embodiment, power source 752 includes wireless charging hardware to charge via proximity to a charging field. In one embodiment, power source 752 can include an internal battery or fuel cell source.

Memory subsystem 760 includes memory device(s) 762 for storing information in device 700. Memory subsystem 760 can include nonvolatile (state does not change if power to the memory device is interrupted) or volatile (state is indeterminate if power to the memory device is interrupted) memory devices, or a combination. Memory 760 can store application data, user data, music, photos, documents, or other data, as well as system data (whether long-term or temporary) related to the execution of the applications and functions of system 700. In one embodiment, memory subsystem 760 includes memory controller 764 (which could also be considered part of the control of system 700, and could potentially be considered part of processor 710). Memory controller 764 includes a scheduler to generate and issue commands to memory device 762.

Connectivity 770 includes hardware devices (e.g., wireless or wired connectors and communication hardware, or a combination of wired and wireless hardware) and software components (e.g., drivers, protocol stacks) to enable device 700 to communicate with external devices. The external device could be separate devices, such as other computing devices, wireless access points or base stations, as well as peripherals such as headsets, printers, or other devices. In one embodiment, system 700 exchanges data with an external device for storage in memory or for display on a display device. The exchanged data can include data to be stored in memory, or data already stored in memory, to read, write, or edit data.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading, uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Thus, anchoring power pins, such as power blade pins are described. The anchoring power pins can increase current capability without requiring additional space on the module. The pins traditionally used as power pins can thus be used for other signal pins or ground pins.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Operations can be combined or broken down into sub-operations. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

The following are some embodiments of the present disclosure.

In one embodiment, a connector for coupling a module with a circuit board includes housing including a module-facing side to receive the module and a circuit board-facing side to couple with the circuit board, and a conductive power pin to both physically anchor the connector to the circuit board and electrically couple the module with the circuit board, the conductive power pin including a tip protruding from the circuit board-facing side of the connector at an orthogonal angle relative to the circuit board to extend into a matching hole in the circuit board.

In one embodiment, a dual in-line memory module (DIMM) connector to couple a DIMM with a circuit board includes housing including a DIMM-facing side to receive the DIMM and a circuit board-facing side to couple with the circuit board, and a conductive power pin to both physically anchor the DIMM connector to the circuit board and electrically couple the DIMM with the circuit board, the conductive power pin including a tip protruding from the circuit board-facing side of the connector to extend into a matching hole in the circuit board.

In one embodiment, a connector for coupling a module with a circuit board includes housing including a module-facing side to accept the module and a circuit board-facing side to couple with the circuit board, and a conductive power pin to deliver power to the module. The conductive power pin has a module-contacting end at least partially contained in the housing to couple with the module and a circuit board-contacting end at least partially external to the housing to couple with the circuit board. The circuit board-contacting end of the conductive power pin includes a tip external to the housing that protrudes away from the circuit board-facing side of the housing in a substantially straight line and has a length to extend into a hole in the circuit board to anchor the connector to the circuit board.

In one embodiment, the tip of the conductive power pin is positioned relative to the circuit board-facing side of the housing at an angle that is greater than 45 degrees. In one embodiment, the tip of the conductive power pin is orthogonal to the circuit board-facing side of the housing. In one embodiment, the tip of the conductive power pin is orthogonal to the circuit board.

In one embodiment, the connector further includes a plurality of conductive power pins, including the conductive power pin. In one embodiment, the housing comprises an elongated body with two ends, wherein the module-facing side and the circuit board-facing side of the housing are located between the two ends. The plurality of conductive power pins comprises an opposing pair of conductive power pins positioned adjacent each of the two ends of the housing. In one embodiment, the connector further includes an ejector at each of the two ends. The opposing pair of conductive power pins at a given one of the two ends is located between the ejector and a signal pin of the connector. In one embodiment, the opposing pair of conductive power pins is to straddle the ejector when the ejector is in an ejected position.

In one embodiment, the conductive power pin is located between two sets of signal pins in a middle section of the connector.

In one embodiment, the connector further includes a second conducive power pin opposite to the conductive power pin located in the middle section of the connector.

In one embodiment, the connector further includes a plurality of signal pins, wherein each of the plurality of signal pins has a module-contacting end at least partially contained in the housing to couple with the module and a circuit board-contacting end at least partially external to the housing to couple with the circuit board. The length of the conductive power pin is greater than a length of a given one of the plurality of signal pins. In one embodiment, the conductive power pin has a width that is greater than a width of a given one of the plurality of signal pins. In one embodiment, the conductive power pin has a thickness that is greater than a width of a given one of the plurality of signal pins.

In one embodiment, the tip of the conductive power pin has a tapered shape. In one embodiment, the tip of the conductive power pin comprises a blade-shaped tip.

In one embodiment, the connector further includes a second conductive power pin opposite to the conductive power pin. In one embodiment, the conductive power pin and the second conductive power pin each include a protruding section between two straight sections external to the housing. In one embodiment, the protruding sections of the conductive power pin and the second conductive power pin protrude away from each other. In one embodiment, the conductive power pin and the second conductive power pin form a conductive fork lock.

In one embodiment, the connector further includes a second conductive power pin opposite to the conductive power pin to form a pair of opposing conductive power pins and rows of opposing signal pins, wherein a distance between the opposing conductive power pins at the circuit board-contacting end is greater than a distance between the rows of opposing signal pins at their corresponding end.

In one embodiment, the conductive power pin has a length to pass through the hole in the circuit board.

In one embodiment, a system includes a circuit board including a through hole and a connector for coupling a module with the circuit board. The connector includes housing including a module-facing side to accept the module and a circuit board-facing side to couple with the circuit board, and a conductive power pin to deliver power to the module. The conductive power pin has a module-contacting end at least partially contained in the housing to couple with the module and a circuit board-contacting end at least partially external to the housing to couple with the circuit board. The circuit board-contacting end of the conductive power pin includes a tip external to the housing that protrudes away from the circuit board-facing side of the housing in a substantially straight line and has a length to extend into a hole in the circuit board to anchor the connector to the circuit board. In one embodiment, the conductive power pin passes through the hole in the circuit board.

Besides what is described herein, various modifications can be made to the disclosed embodiments and implementations of the invention without departing from their scope. Therefore, the illustrations and examples herein should be construed in an illustrative, and not a restrictive sense.

What is claimed is:

1. A connector for coupling a module with a circuit board, the connector comprising:
   housing including a module-facing side to receive the module and a circuit board-facing side to couple with the circuit board;
   a conductive power pin to both physically anchor the connector to the circuit board and electrically couple the module with the circuit board, the conductive power pin including a tip protruding from the circuit board-facing side of the connector at an orthogonal angle relative to the circuit board to extend into a matching hole in the circuit board; and
   a plurality of signal pins, wherein each of the plurality of signal pins has a module-contacting end at least partially contained in the housing to couple with the module and a circuit board-contacting end at least partially external to the housing to couple with the circuit board;
   wherein a length of a portion of the conductive power pin that is external to the housing is greater than a length of a portion of one of the plurality of signal pins that is external to the housing.

2. The connector of claim 1, wherein the tip of the conductive power pin comprises a tip extending in a straight line away from the circuit board-facing side of the housing.

3. The connector of claim 1, further comprising a plurality of conductive power pins, including the conductive power pin.

4. The connector of claim 1, wherein the conductive power pin is located between two sets of signal pins in a middle section of the connector.

5. The connector of claim 1, further comprising an opposing pair of conductive power pins located in a middle section of the connector.

6. The connector of claim 1, wherein the conductive power pin has a width that is greater than a width of a given one of the plurality of signal pins.

7. The connector of claim 1, wherein the conductive power pin has a thickness that is greater than a width of a given one of the plurality of signal pins.

8. The connector of claim 1, wherein the tip of the conductive power pin has a tapered shape.

9. The connector of claim 1, wherein:
   the tip of the conductive power pin comprises a blade-shaped tip.

10. The connector of claim 1, further comprising:
    a second conductive power pin opposite to the conductive power pin to form a pair of opposing conductive power pins;
    wherein a tip of each of the opposing pair of conductive power pins that is external to the housing comprises a non-straight section between two straight sections.

11. The connector of claim 1, further comprising:
    a pair of opposing conductive power pins, including the conductive power pin; and
    rows of opposing signal pins;
    wherein a distance between the opposing conductive power pins at the circuit board-facing side is greater than a distance between the rows of opposing signal pins at their corresponding end.

12. The connector of claim 1, wherein the module comprises a dual in-line memory module (DIMM), and the connector comprises a DIMM connector.

13. The connector of claim 2, wherein the tip of the conductive power pin is orthogonal to the circuit board-facing side of the housing.

14. The connector of claim 3, wherein:
    the plurality of conductive power pins comprises an opposing pair of conductive power pins positioned adjacent to each of two ends of the housing at the circuit board-facing side of the housing.

15. The connector of claim 14, further comprising:
    an ejector at each of the two ends;
    wherein the opposing pair of conductive power pins at a given one of the two ends is located between the ejector and a signal pin of the connector.

16. The connector of claim 15, wherein the opposing pair of conductive power pins are spaced apart from each other by a distance to straddle the ejector when the ejector is in an ejected position.

17. The connector of claim 10, wherein the non-straight sections of the pair of opposing conductive power pins protrude away from each other.

18. The connector of claim 10, wherein the pair of opposing conductive power pins comprise a conductive fork lock.

19. A system comprising:
    a circuit board comprising a through hole; and
    a connector for coupling a module with the circuit board, the connector comprising:
    housing including a module-facing side to receive the module and a circuit board-facing side to couple with the circuit board;
    a conductive power pin to both physically anchor the connector to the circuit board and electrically couple the module with the circuit board, the conductive power pin including a tip protruding from the circuit board-facing side of the connector at an orthogonal angle relative to the circuit board to extend into the through hole in the circuit board; and
    a plurality of signal pins, wherein each of the plurality of signal pins has a module-contacting end at least partially contained in the housing to couple with the module and a circuit board-contacting end at least partially external to the housing to couple with the circuit board;
    wherein a length of a portion of the conductive power pin that is external to the housing is greater than a length of a portion of one of the plurality of signal pins that is external to the housing.

20. The system of claim 19, further comprising the module to be received by the connector to couple with the circuit board, wherein the module comprises a dual inline memory module.

\* \* \* \* \*